United States Patent [19]

Komaki

[11] Patent Number: 4,704,003
[45] Date of Patent: Nov. 3, 1987

[54] ELECTRONIC APPARATUS WITH FLEXIBLE DISPLAY

[75] Inventor: Shigeki Komaki, Nara, Japan

[73] Assignee: Sharp Kabushiki Kaisha, Osaka, Japan

[21] Appl. No.: 800,141

[22] Filed: Nov. 20, 1985

[30] Foreign Application Priority Data

Nov. 20, 1984 [JP] Japan ................................ 59-246669

[51] Int. Cl.$^4$ ............................................. G02F 1/133
[52] U.S. Cl. ................... 350/344; 350/331 R; 350/334; 340/365 A; 340/815.14; 439/449
[58] Field of Search .................. 350/334, 331 R, 344; 340/365 A, 815.14; 339/103 R; 156/99, 101, 102

[56] References Cited

U.S. PATENT DOCUMENTS

| 3,940,637 | 2/1976 | Ohigashi et al. | 340/365 A |
| 4,017,848 | 4/1977 | Tannas, Jr. | 350/334 |
| 4,150,878 | 4/1979 | Barzilai | 350/344 |
| 4,224,093 | 9/1980 | Kohyama et al. | 350/344 |
| 4,295,712 | 10/1981 | Ishiwatari | 350/344 |
| 4,514,042 | 4/1985 | Nukii et al. | 350/334 |
| 4,597,635 | 7/1986 | Hoshikawa | 350/334 |

FOREIGN PATENT DOCUMENTS

| 3235895 | 9/1982 | Fed. Rep. of Germany . |
| 2061569 | 6/1980 | United Kingdom . |
| 2116777 | 2/1983 | United Kingdom . |

*Primary Examiner*—John K. Corbin
*Assistant Examiner*—Martin Lerner
*Attorney, Agent, or Firm*—Birch, Stewart, Kolasch & Birch

[57] ABSTRACT

A display panel includes a first base, a second base, a flexible display for displaying, the first base, the flexible display, and the second base being successively layered, and a cavity disposed on the second base, for providing an allowance space of somewhat shifting the position of the flexible display by the stress applied thereto. The cavity formed in a concave shape is operated to scatter the stress to the flexible display.

12 Claims, 4 Drawing Figures

ELECTRONIC APPARATUS WITH FLEXIBLE DISPLAY

BACKGROUND OF THE INVENTION

The present invention relates to an electronic apparatus and, more particularly, to an electronic apparatus with a flexible display such as a flexible liquid crystal display which enables a high display quality even when a stress from the outside is applied to the flexible display. The present invention, in particular, relates to a packaging structure of a flexible display such as a flexible liquid crystal display in an electronic apparatus.

The cell thickness of the flexible liquid crystal display may be changed according to a stress from the outside, so that the display of the flexible liquid crystal display may become unstable and the orientation of the liquid crystal molecules in the flexible liquid crystal display may be inverted. As a result, the display quality of the flexible liquid crystal display may be remarkably reduced. The provide the good display quality, the thickness of the electronic apparatus is limited.

Accordingly, it is desired that a novel electronic apparatus be provided to enable a high display quality of a flexible display such as a flexible liquid crystal display even when a stress from the outside is applied to the flexible display.

SUMMARY OF THE INVENTION

Accordingly, it is an object of the present invention to provide an improved electronic apparatus with a flexible display such as a flexible liquid crystal display which enables a high display quality of the flexible display even when a stress from the outside is applied to the flexible display.

It is another object of the present invention to provide a card-type electronic apparatus which can package a flexible liquid crystal display so that the display of the flexible liquid crystal display is not unstable and the orientation of liquid crystal moleculars in the flexible liquid crystal display is unchanged.

It is a further object of the present invention to provide a packaging structure of a flexible display such as a flexible liquid crystal display, for example, used in a thin electronic apparatus, which can scatter the stress to the flexible liquid crystal display from the outside without using an additional component so that the display of the flexible liquid crystal display is not unstable and the orientation of the liquid crystal molecules is not inverted.

Other objects and further scope of applicability of the present invention will become apparent from the detailed description given hereinafter. It should be understood, however, that the detailed description of and specific examples, while indicating preferred embodiments of the invention, are given by way of illustration only, since various changes and modifications within the spirit and scope of the invention will become apparent to those skilled in the art from this detailed description.

To achieve the above objects, according to an embodiment of the present invention, a display panel comprises first basse means and second base means, flexible display means for displaying, said first base means, said flexible display means, and said second base means being successively layered, and space means disposed on the second base means, for providing an allowance space permitting some shifting of the position of flexible display means by the stress applied thereto. The space means including a concave cavity acts to scatter the stress to said flexible display means.

When the present invention is applied to a liquid crystal display panel, a liquid crystal display panel comprises first base means and second base means, flexible liquid crystal display means for displaying, said first base means, said flexible liquid crystal display means, and said second base means being successively layered, and space means disposed on said second base means, for providing an allowance space permitting some shifting of the position of said flexible liquid crystal display means by stress applied thereto. The space means includes a cavity provided on said second base means. The flexible liquid crystal display means includes a display area interposing liquid crystals and a seal portion for sealing the liquid crystals, and the display area of the flexible liquid crystal display faces the cavity. The seal portion is sandwiched between the first and second base means. Therefore, the space means acts to scatter the stress to the flexible liquid crystal display means.

BRIEF DESCRIPTION OF THE DRAWINGS

The present invention will be better understood from the detailed description given hereinbelow and the accompanying drawings which are given by way of illustration only, and thus are not limitative of the present invention and wherein.

DETAILED DESCRIPTION OF THE PREFERRED EMBODIMENTS

Figure 1:
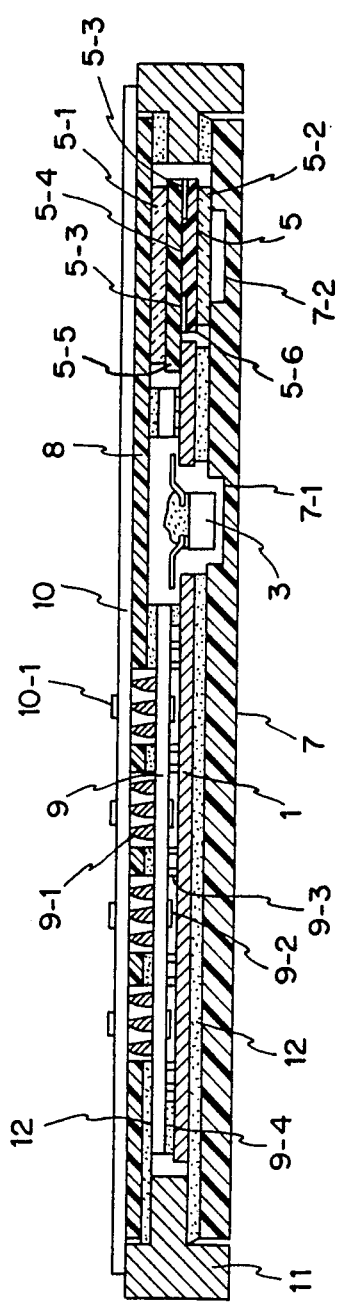
FIG. 1 shows a sectional view of an electronic apparatus such as a card-type electronic calculator according to an embodiment of the present invention.

A preferred embodiment of the present invention is now described in terms of a card-type electronic calculator although not limited to the card-type electronic calculator. Although a liquid crystal display is used as a flexible display in an embodiment of the present invention, the flexible display should not be limited to the liquid crystal display. The present invention may be applied to various flexible displays other than the liquid crystal display. FIG. 1 shows a sectional view of a thin electronic apparatus, in particular, a card-type electronic calculator according to the present invention.

The electronic calculator of FIG. 1, mainly, comprises a lower panel 7 as a lower base, a movement 1, a key film 9, an upper panel 8 as an upper base, and a frame 11.

Figure 2:
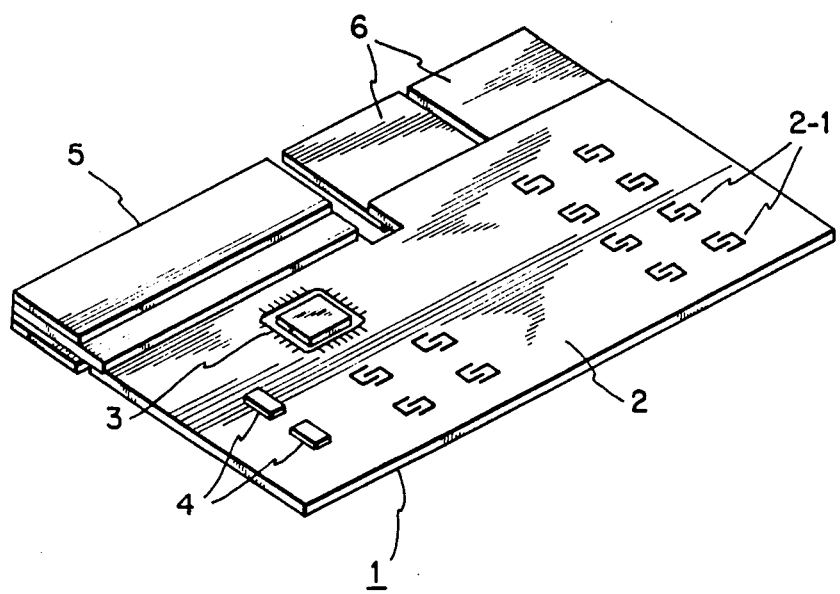
FIG. 2 shows a perspective view of a movement in the electronic apparatus of FIG. 1.

The movement 1 of FIG. 2 comprises key contact electrodes 2-1 on one surface a film substrate 2, an LSI circuit element 3 for controlling the operation of the electronic calculator, chip components 4, a flexible liquid crystal display 5, and a power supply 6 such as solar cells. The flexible liquid crystal display 5 is formed in a film shape. The power supply 6 may be flexible and formed in a film shape. The flexible liquid crystal display 5, the power supply 6, the LSI circuit element 5, and the chip components 4 are electrically connected to each other. The movement 1 is adhered by an adhesive 12 on the inner surface of the lower panel 7 so that the key contact electrodes 2-1 appear on the outer surface of the combination of the movement 1 and the lower panel 7.

A key film 9 is positioned on the movement 1 corresponding to the key contact electrodes 2-1 of the movement 1, and is adhered on the movement 1 via spacers 9-3 by an adhesive 9-4. The key film 9 has key contacts 9-2 on one surface of the key film 9 and projections 9-1 on the other surface of the key film 9 corresponding to the key contacts 9-2. The several projections each correspond to a single contact area of the key contacts 9-2. Each of the key contact electrodes 2-1 is faced and opposite to a respective one of the key contacts 9-2 provided on one surface of the key film 9.

The flexible liquid crystal display 5 includes a polarizer 5-1, a polarizer 5-2 with a reflection plate, and two flexible bases 5-5 and 5-6 forming a liquid crystal-binding and -sealing portion 5-3 and a liquid crystal display portion 5-4. Liquid crystals are interposed and sealed between the two flexible bases 5-5 and 5-6. The polarizers 5-1 and 5-2 are disposed on the outer surfaces of the flexible bases 5-5 and 5-6, respectively The edges 5-3 of the flexible bases 5-5 and 5-6 are bonded to each other.

Figure 3:
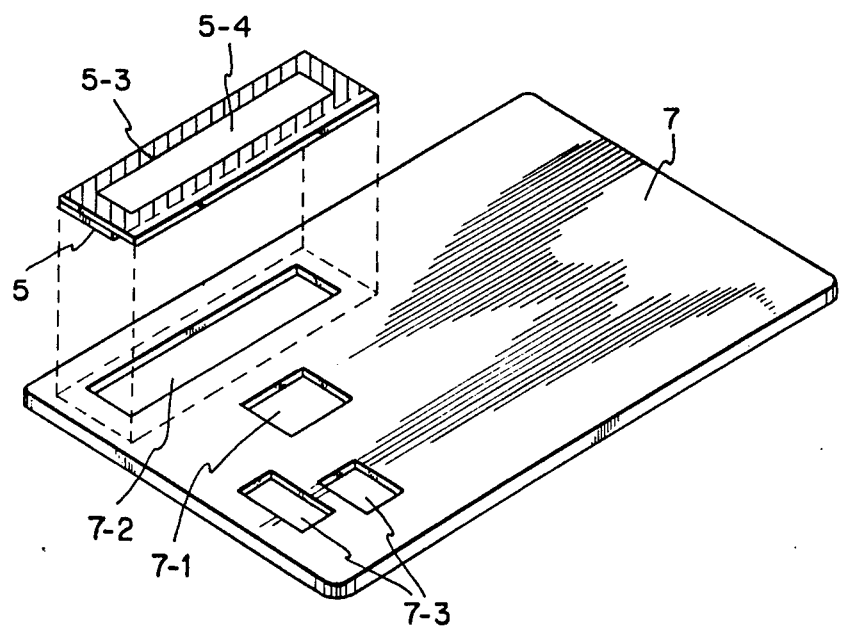
FIG. 3 shows a perspective view of a lower panel and a flexible liquid crystal display used in the electronic apparatus of FIG. 1.

The lower panel 7 is flexible, and has a cavity 7-1 at the portion opposite to the LSI circuit element 3 of the movement 1, and a cavity 7-2 at the portion opposite to the display area 5-4 of the flexible liquid crystal display 5, in other words, at the portion surrounded by the bonded and sealed portions 5-3. The cavities 7-1 and 7-2 may be formed by an etching technique. The cavity 7-1 provides an allowance space permitting some shifting of the position of the LSI circuit element 3 by a stress applied to thereto. The cavity 7-2 provides an allowance space permitting some shifting of the position of the flexible liquid crystal display 5 by a stress applied to thereto. In other words, the spaces defined by the cavities 7-1 and 7-2 are operable to scatter the stress to the LSI circuit element 3 and the flexible liquid crystal display 5, respectively. The cavities 7-1 and 7-2 are formed in a concave (⌐⌐) shape. As illustrated in FIG. 3, the lower panel 7 may be provided with cavities 7-3 at the portions opposite to the chip components 4 so that the cavities 7-3 provide allowance spaces of somewhat shifting of the chip components 4 by the stress applied thereto and the stress to the chip components 4 are scattered or discharged into the space in the cavities 7-3.

The upper panel 8 is flexible, and has at least one transparent window provided at the portion opposite to the display portion 5-4 of the flexible liquid crystal display 5. The upper panel 8 is adhered on the key film 9 by the adhesive 12. A decoration film 10 is adhered on the upper panel 8. The decoration film 10 may be integrally provided with the upper panel 8. The key symbols are printed on the decoration film 10 corresponding to the key contact electrodes 2-1 on the movement 1. The frame 11 is provided to fix the above components, and is formed so that a member of "T" shaped cross-section surrounds the peripheries of the upper panel 8 and the lower panel 7.

In FIG. 1, the movement 1 is sandwiched between the upper panel 8 and the lower panel 7. The frame 11 is engaged and fixed at the peripheries of the upper panel 8 and the lower panel 7. The frame 11 is adhered at the peripheries of the upper and the lower panels 7 and 8 by the adhesive 12. When the movement 1 is sandwiched, only the bonded and sealed portions 5-3 of the flexible liquid crystal display 5 is sandwiched by the upper and the lower panels 7 and 8, so that the change in thickness of the display cell and the carve of the display cell are reformed to maintain a flat display even when the stress is applied to the flexible liquid crystal display 5.

Because the cavity 7-2 is formed on the lower panel 7 opposite to the display portion 5-4 of the flexible liquid crystal display 5, the cavity 7-2 provides an allowance space permitting some shifting of the position of the flexible liquid crystal display 5 by a stress applied thereto, so that the stress to the display portion 5-4 of the liquid crystal display 5 from the outside scatters or dischages into the space defined by the cavity. Accordingly, the display of the liquid crystal display 5 cannot become unstable and the orientation of the liquid crystal molecules cannot be inverted. These results ensure a high display quality of the liquid crystal display 5.

Figure 4:
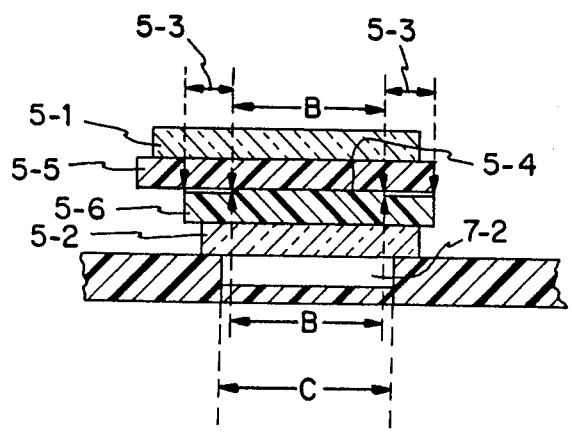
FIG. 4 shows a sectional view of the lower panel and the flexible liquid crystal display as shown in FIG. 1.

In the present invention, as shown in FIG. 4, the flexible liquid crystal display 5 is disposed on the lower panel 7 so that the cavity 7-2 such as a concave (⌐⌐) cavity at the inner surface of the lower panel 7 faces and opposes to the display portion 5-4 of the flexible liquid crystal display 5. The width C of the cavity 7-2 is equal to or greater than the width B of the display portion 5-4 of the liquid crystal display 5. Although the lower panel 7, the flexible liquid crystal display 5, and the upper panel 8 are successively layered, only the bonded and sealed portions 5-3 of the flexible liquid crystal display 5 are sandwiched by the lower and the upper panels 7 and 8 to form the flat display. As the entire display area 5-4 of the liquid crystal display 5 faces the cavity 7-2, the cavity 7-2 provides an allowance space permitting some shifting of the position of the flexible liquid crystal display 5 by a stress applied to thereto, in other words, a stress to the flexible liquid crystal display 5 is scattered or discharged over the space defined by the cavity.

The adhesives 9-4 and 12 may be a hot melt type adhesive. The adhesive 9-4 and/or 12 may be formed in a film sheet type.

As described above, the cavity is formed on the inner surface of the lower panel corresponding to the display area of the liquid crystal display. The liquid crystal display is sandwiched between the lower and the upper panels so that the display is flat. Therefore, the cavity provides an allowance space permitting some shifting of the position of the flexible liquid crystal display by a stress applied thereto. In other words, a stress to the liquid crystal display is scattered or discharged by the space defined by the cavity without using an additional member. Accordingly, the flexible liquid crystal display can be packaged so that its display is not unstable and the orientation of the liquid crystal display is not inverted by a stress to the liquid crystal display. Thus, this packaging of the liquid crystal display ensures high display quality with low costs.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A display panel comprising:
first base means and second base means;

flexible display means for displaying, said first base means, said flexible display means, and said second base means being successively layered, and space means disposed on said second base means, for providing an allowance space permitting some shifting of the position of said flexible display means by the stress applied thereto.

2. The display panel of claim 1, wherein said space means acts to scatter stress applied to said flexible display means.

3. The display panel of claim 1, wherein said space means includes a concavecavity provided on said second base means.

4. A liquid crystal display panel comprising:
first base means and second base means;
flexible liquid crystal display means for displaying, said first base means, said flexible liquid crystal display means, and said second base means being successively layered, and
space means disposed on said second base means, for providing an allowance space permitting some shifting of the position of said flexible liquid crystal display means by stress applied thereto.

5. The liquid crystal display panel of claim 4, wherein said space means includes a cavity defined on said second base means.

6. The liquid crystal display panel of claim 5, wherein the flexible liquid crystal display means includes a display area interposing liquid crystals and a seal portion for sealing the liquid crystals, and the display area of the flexible liquid crystal display overlies the cavity.

7. The liquid crystal display panel of claim 6, wherein the seal portion is sandwiched between the first and second base means.

8. The liquid crystal display panel of claim 4, wherein said space means acts to scatter stress applied to said flexible liquid crystal display means.

9. An electronic apparatus comprising:
input means for inputting an information;
circuit means responsive to said input means, for operating said electronic apparatus;
a flexible liquid crystal display panel for displaying responsive to said circuit means and said input means, said flexible liquid crystal display comprising:
first base means and second base means;
flexible liquid crystal display means for displaying, said first base means, said flexible liquid crystal display means, and said second base means being successively layered, and
space means disposed on said second base means, for providing an allowance space permitting some shifting of the position of said flexible liquid crystal display means by stress applied thereto.

10. The electronic apparatus of claim 9, wherein said space means acts to scatter stress applied to said flexible liquid crystal display means.

11. The electronic apparatus of claim 9, wherein the space means includes a cavity defined on the second base means.

12. The electronic apparatus of claim 9, wherein said flexible liquid crystal display means includes a display area interposing liquid crystals and a seal portion for sealing the liquid crystals, and the display area of the flexible liquid crystal display overlies the cavity and the seal portion is sandwiched between the first and second base means.

* * * * *